(12) United States Patent
Bende

(10) Patent No.: US 9,537,018 B2
(45) Date of Patent: Jan. 3, 2017

(54) PHOTOVOLTAIC CELL

(75) Inventor: Evert Eugène Bende, Petten (NL)

(73) Assignee: STICHTING ENERGIEONDERZOEK CENTRUM NEDERLAND, Petten (NL)

( * ) Notice: Subject to any disclaimer, the term of this patent is extended or adjusted under 35 U.S.C. 154(b) by 75 days.

(21) Appl. No.: 14/126,229

(22) PCT Filed: Jun. 14, 2012

(86) PCT No.: PCT/NL2012/050419
§ 371 (c)(1),
(2), (4) Date: Feb. 27, 2014

(87) PCT Pub. No.: WO2012/173480
PCT Pub. Date: Dec. 20, 2012

(65) Prior Publication Data
US 2014/0166102 A1 Jun. 19, 2014

(30) Foreign Application Priority Data
Jun. 14, 2011 (NL) .................................. 2006932

(51) Int. Cl.
*H01L 31/0224* (2006.01)
*H01L 31/02* (2006.01)
(Continued)

(52) U.S. Cl.
CPC ... *H01L 31/02021* (2013.01); *H01L 31/02245* (2013.01); *H01L 31/022433* (2013.01);
(Continued)

(58) Field of Classification Search
CPC .... H01L 31/00; H01L 31/02; H01L 31/02002; H01L 31/02008; H01L 31/0201; H01L 31/0224; H01L 31/022425; H01L 31/022433; H01L 31/04; H01L 31/042
See application file for complete search history.

(56) References Cited

U.S. PATENT DOCUMENTS

| 6,143,976 A | 11/2000 | Endros |
| 6,573,445 B1 | 6/2003 | Burgers |
| (Continued) | | |

FOREIGN PATENT DOCUMENTS

| CN | 101038942 A | 9/2007 |
| CN | 101373780 A | 2/2009 |
| (Continued) | | |

OTHER PUBLICATIONS

English machine translation of Meyer et al. (WO 2011/067338) published on Jun. 9, 2011.*
(Continued)

*Primary Examiner* — Christina Chern
(74) *Attorney, Agent, or Firm* — Jackson Walker LLP

(57) ABSTRACT

A photo-voltaic cell has a first and second two-dimensional array of contact points on the first surface, each coupled to a respective one of base and emitter areas in or on the semi-conductor body. Electrically separate first and second conductor structures on the first surface emanate from each contact point, coupled to contact points of the first and second two-dimensional array respectively. The first conductor structure comprises sets of first conductor line branches, the first conductor line branches of each set branching out from a respective one of the contact points of the first two-dimensional array in at least three successive different directions at less than a hundred and eighty degrees to each other. The second conductor structure comprise second conductor line branches in at least three different directions in areas between respective pairs of adjacent non-parallel ones of the first conductor line branches, each second conductor line branch coupled at least to a respective one of the contact points of the second two-dimensional array.

11 Claims, 4 Drawing Sheets

(51) Int. Cl.
*H01L 31/05* (2014.01)
*H01L 31/18* (2006.01)

(52) U.S. Cl.
CPC ...... *H01L 31/0516* (2013.01); *H01L 31/1804* (2013.01); *Y02E 10/547* (2013.01); *Y02P 70/521* (2015.11)

(56) References Cited

U.S. PATENT DOCUMENTS

| | | | |
|---|---|---|---|
| 2004/0043528 A1 | 3/2004 | Kruhler | |
| 2007/0074756 A1* | 4/2007 | Yagiura et al. | 136/244 |
| 2008/0216887 A1* | 9/2008 | Hacke | H01L 31/0516 136/244 |
| 2009/0288702 A1* | 11/2009 | Kim et al. | 136/251 |
| 2011/0146747 A1* | 6/2011 | Hieslmair | H01L 31/048 136/244 |

FOREIGN PATENT DOCUMENTS

| | | |
|---|---|---|
| DE | 19525720 A1 | 1/1997 |
| EP | 2325896 A2 | 5/2011 |
| WO | 2011/031156 | 3/2011 |
| WO | 2011/067338 | 6/2011 |

OTHER PUBLICATIONS

Bultman, J.H., et al; Fast and Easy Single Step Module Assembly for Back-Contacted C-Si Solar Cells With Conductive Adhesives; World Conference and Exhibition on Photovoltaic Solar Energy Conversion, vol. 3, No. 40-D13-03, May 11, 2003, pp. 979-982.

Romjn, I.G., et al; An Overview of MWT Cells and Evolution to the Aspire Concept: A New Integrated Mc-Si Cell and Module Design for High-Efficiencies; 23rd European Photovoltaic Solar Energy Conference, Sep. 1, 2008, pp. 1000-1005.

Chinese Patent Office; Chinese Search Report; Chinese Patent Application No. 2012800386557; 2 pages, Jun. 29, 2015.

* cited by examiner

PHOTOVOLTAIC CELL

FIELD OF THE INVENTION

The invention relates to a photovoltaic cell comprising first and second sets of conductors on a back surface of the cell, coupled to emitter and base areas on the back surface, for collecting currents from charge carriers of mutually opposite polarity respectively.

BACKGROUND

The collection efficiency of photovoltaic cells depends on many factors, including the design of the conductor system that is used to conduct currents from charge carriers of mutually opposite polarity in the cell from the emitter and base. In the art, two classes of conductor systems are known: one class in which electrically separate grids are provided for the emitter and base on the front and back surface of the cell and one class in which electrically separate grids for the emitter and base are provided on the same surface (the back surface). Conventionally grids are used that have one or more relatively wide central conductor lines, called the bus bar and parallel straight linear fingers of relatively narrow elongated shape emanating from the central conductor line. Thus effectively, H shaped connection pattern are provided, the bus bar forming the horizontal line of the H.

U.S. Pat. No. 6,573,445 shows photovoltaic cells with separate base and emitter grids on opposite surfaces wherein the density of the fingers is varied with distance from the central line. The document also shows photo-voltaic cells wherein the area covered by the front surface grid is reduced by using repeated sub-regions each with conductor lines that radiate from one or more concentric circular lines, with an increasing number of bifurcations in the radiating lines with distance from the centre.

In the class of photovoltaic cells wherein both electrically separate grids are provided on the back surface, interdigitated conductor grids are used. Such cells are called IBC cells (Interdigitated Back Contact cells). Each grid has a H- or E-shaped pattern with a series of straight parallel fingers of a long narrow shape emanating from a bus bar. The fingers of both grids run in parallel, the length of each finger of one grid extending between the lengths of a different pair of fingers of the other grid. In this way each fingers of both grids can be realized in close proximity of a finger of the other grid.

However, the bus bars give rise to efficiency loss due to enhanced recombination underneath the central lines, which is sometimes called electric shading.

SUMMARY

Among others, it is an object to provide for a photovoltaic cell wherein currents of both polarities can be collected from the back surface with less loss.

According to one aspect, a photo-voltaic cell is provided that comprises
 a semi-conductor body having a first and second surface opposite each other;
 a first and second two-dimensional array of contact points on the first surface, each coupled to a respective one of base and emitter areas in or on the semi-conductor body;
 electrically separate first and second conductor structures, both on the first surface, coupled to contact points of the first and second two-dimensional array respectively;
 the first conductor structure comprising sets of first conductor line branches, the first conductor line branches of each set branching out from a respective one of the contact points of the first two-dimensional array in at least three successive different directions at less than a hundred and eighty degrees to each other;
 the second conductor structure comprising second conductor line branches in at least three different directions in areas between respective pairs of adjacent ones of the first conductor line branches, the first conductor line branches of different ones of the respective pairs being non parallel to the first conductor line branches of other ones of the respective pairs, the first conductor line branches including pairs each second conductor line branch coupled at least to a respective one of the contact points of the second two-dimensional array.

The first and second surface may be the back and front surface of the photo-voltaic cell, respectively, which will be turned away from and towards the sun for example. The contact points may replace the bus bars of known photovoltaic cells. For example, the output terminal of one electrical pole of the photo-voltaic cell may be coupled to each of the contact points of the first two dimensional array. Instead of using interdigitated conductor fingers that are all parallel, interdigitation of conductor lines at more angles is used. The need for a broad bus bar is avoided because the first conductor line branches branch out from the contact point in a plurality of directions, wherein the first conductor line branches may have equal width and may be provided for example in directions radiating from the contact point. Preferably, the base area is kept as small as possible to prevent electrical shading, i.e. enhanced recombination in the base or at the surface. From the viewpoint of increasing the current, the emitter area fraction is preferable as large as possible. However, the emitter area is limited since resistive losses due to lateral current flow will reduce the efficiency. Lateral current flow will also cause a voltage gradient in the lateral direction which makes that the diodes formed by the emitter-base junction are not operated at the maximum power point. This is also referred to as distributed series resistance losses.

In an embodiment the branches of at least part of the pairs between which the conductor line branches of the second conductor structure extend are non-parallel within the pair. Thus a closer spacing is made possible.

In an embodiment the first conductor line branches branch into a tree structure with increasing numbers of branch conductor lines with distance from the respective one of the contact points. In this way a first conductor structure with substantially uniform density can be realized, so that the maximum distance from surface points on the first surface to the first conductor structure does not need to become large for surface points further away from the contact point.

In an embodiment the second conductor line branches extend to areas between each pair of adjacent branches in the tree structure. In this way the maximum distance from surface points on the first surface to the second conductor structure does not need to become large for surface points closer to the contact point.

In an embodiment the first conductor line branches the second conductor line branches in the areas between the respective pairs of adjacent non-parallel ones of the first conductor line branches extend at least partly along a virtual line that bisects an angle between the first conductor line branches in the pair. In this way the maximum distances between the conductor line branches may be kept small with a minimum of conductor area.

In an embodiment the photo-voltaic has a periodic pattern of unit cells with first and second conductor line branches from the first and second conductor structures, wherein the first conductor structure in the unit cell comprises conductor line branches radiating from a first one of the contact points within the unit cell, and the second conductor structure comprises conductor lines along a border of the unit cell as well as branch conductor lines from the border into the unit cell. This makes it possible to realize the photo-voltaic cell with a limited variation in the conductor lines. The unit cells may be rectangular (e.g. square) or hexagonal for example.

In a further embodiment the contact points of the second two-dimensional array are located on the borders of the unit cells, in electrical contact with the conductor lines along the borders. The contact points of the second two-dimensional array may in fact be located where the borders from corners of the unit cell. In this way the use of broad bus bars can be avoided In an embodiment the contact points may be located at the same positions in each cell, but in another embodiments the contact points may be located differently in different unit cells, for example in unit cells at the edge of the periodic pattern. Some contact points may lie astride a plurality of unit cells for example, crossing the border of a unit cell, and some may be located inward, merely touching the border.

In a further embodiment the branch conductor lines of the second conductor structure in the unit cell branch into a tree structure with increasing numbers of branch conductor lines with decreasing distance to the first one of the contact points in the unit cell. In this way the maximum distances between the conductor line branches may be kept small with a minimum of conductor area.

In a further embodiment at least part of the branch conductor lines in the tree structure of the second conductor lines is bent, at least part of the branch conductor lines having a tip, the tips of the at least part of the branch conductor lines being directed at a respective branch point where the first conductor line branches branch into multiple first conductor line branches. In this way the maximum distances between the conductor line branches may be kept small with a minimum of conductor area.

BRIEF DESCRIPTION OF THE DRAWING

These and other objects and advantageous aspects will become apparent from a description of exemplary embodiments using the following figures

DETAILED DESCRIPTION OF EXEMPLARY EMBODIMENTS

The photo-voltaic cell comprises a semi-conductor body with a relatively small thickness compared to its diameter (e.g. length and/or height). The semi-conductor body has a first and second surface, separated by the thickness of the semi-conductor body. The first and second surface will be called the back surface and the front surface, because during use the second surface will face an energy providing light source (e.g. the sun) and the first surface will be turned away from the light source.

The semi-conductor body has a first conductivity type (p or n) due to doping. A patterned layer of a second conductivity type opposite to the first conductivity type (n or p) is provide in or on the back surface. Where present, the patterned layer defines a semiconductor junction between the bulk of the semi-conductor body and the patterned layer. A first set of electrodes (emitter electrodes) on the back surface is coupled to first areas where the patterned layer is present and a second set of electrodes (base electrodes) on the back surface is coupled to second areas where the patterned layer is not present. Instead a patterned layer with enhanced conductivity of the same conductivity type as the bulk of the semi-conductor body may be provided in the second areas, forming a back surface field.

Figure 1:
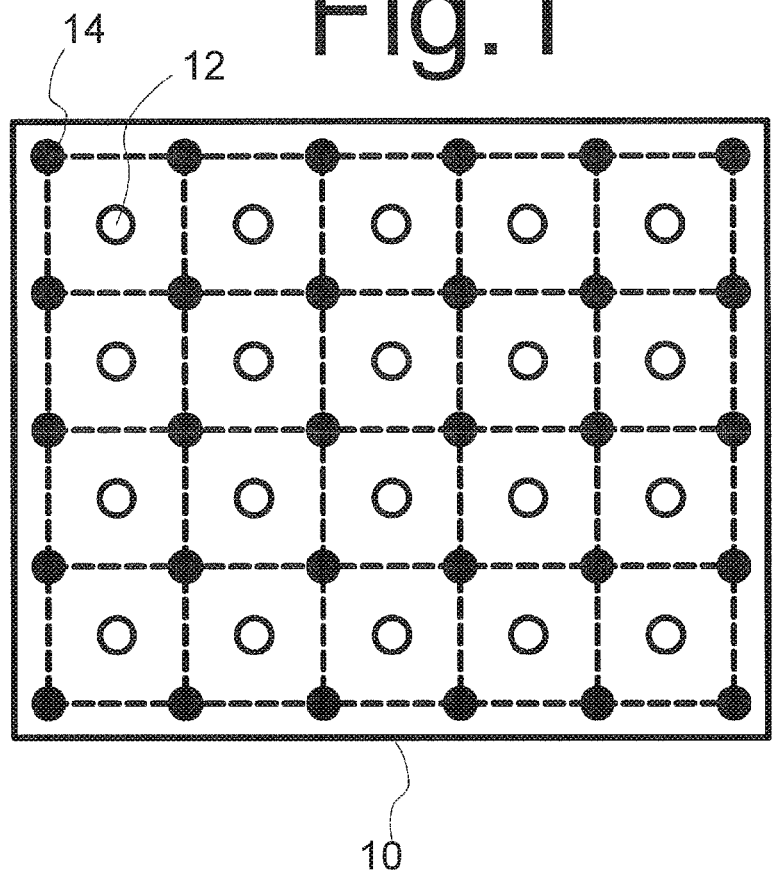
FIG. 1 shows a back surface of a photo-voltaic cell with an array structure

FIG. 1 schematically shows the back surface 10 of the photo-voltaic cell, with a two-dimensional array of first and second contacts 12, 14 to the emitter electrodes (not shown) and the base electrodes (not shown). By way of example an array with a two-dimensionally periodic arrangement of square unit cells is shown (indicated by dashed lines), with the first contacts 12 at the central points of the unit cells and the second contacts 12 at the corners of the unit cells.

Figure 2:
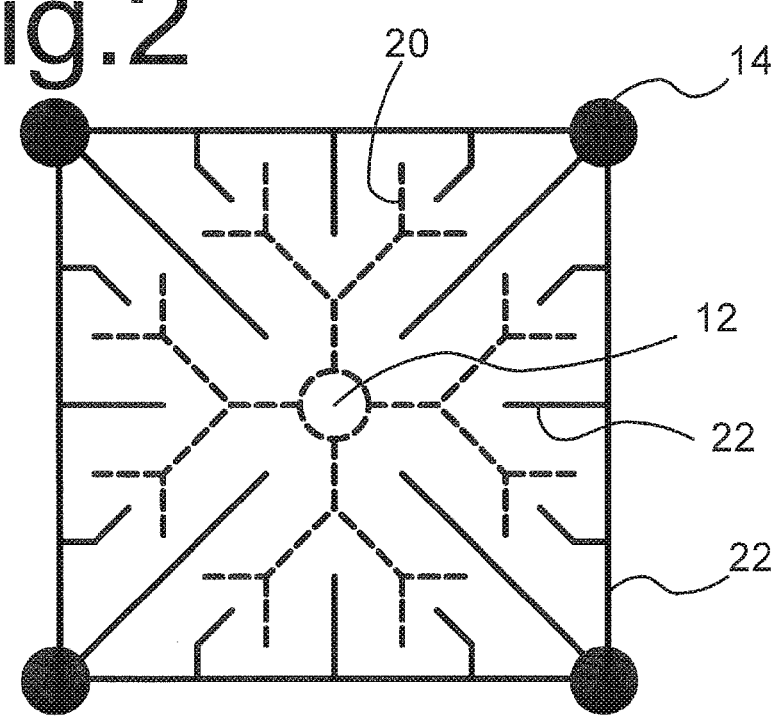
FIG. 2 shows a conductor pattern in a unit cell of the array FIG. 3, 4 show conductor patterns of further unit cells

FIG. 2 schematically shows an example of a conductor pattern in a unit cell of the two-dimensional array. This conductor pattern in the unit cell may be periodically repeated in two dimensions on the back surface of the photo-voltaic cell. The conductor pattern comprises first conductor lines 20 emanating from the first contact 12 at the central position of the unit cell and second conductor lines 22 coupled to the second contacts 14 at the corners of the unit cell.

For the sake of illustration, first conductor lines 20 are shown by dashed lines, but is should be understood that they form continuous conductors. First conductor lines 20 radiate at a plurality of angles from first contact 12 in directions that are not all parallel to each other. By way of example a unit cell has been shown wherein the conductor lines 20 at ninety degrees from each other (at zero, ninety, a hundred and eighty and at two hundred and seventy degrees). But different angles may be used, for example three angles at a hundred and twenty degrees, seventy two degrees, sixty degrees etc, or at irregularly different angles. The first conductor lines 20 radiating from first contact 12 will be called first order branches. The first order branches branch out into second order branches and so on, the distance from first contact 12 increasing along the branches of each order.

Second conductor lines 22 include conductor lines that run between the second contacts 14 along the borders of the unit cell and branch conductor lines that branch off from the conductor lines along the borders into the unit cell into regions between the branches of first conductor lines 20. In the illustrated example each pair of branches at each order of the first conductor lines 20 has one corresponding branch of the second conductor line 22 respectively. The corresponding branch of second conductor line 22 of a pair of branches of the first conductor lines 20 extends from the border of the unit cell (the border including second contacts 14) to a position between the pair of branches, i.e. a virtual line between the end points of the branches intersects their corresponding second conductor line 22.

In order to reduce recombination loss, it is preferred that the maximum distance from any point on the back surface to any one of the first and second conductor lines 20, 22 is kept small. To do so it is preferred that at least the tips of the branches of the second conductor line 22 run along a virtual line that bisects the angle formed between adjacent branches of the first conductor line 20. Where there is a branch point where a pair of branches of the first conductor line 20 branch out at an acute angle or a ninety degree angle, a branch of the second conductor line 22 is preferably located between these branches of the first conductor line 20 with at least a tip part of the branch of the second conductor line 22 directed towards the branch point. In this way the maximum distance from any point on the back surface to any one of the first and second conductor lines 20, 22 is kept small.

Figure 3:
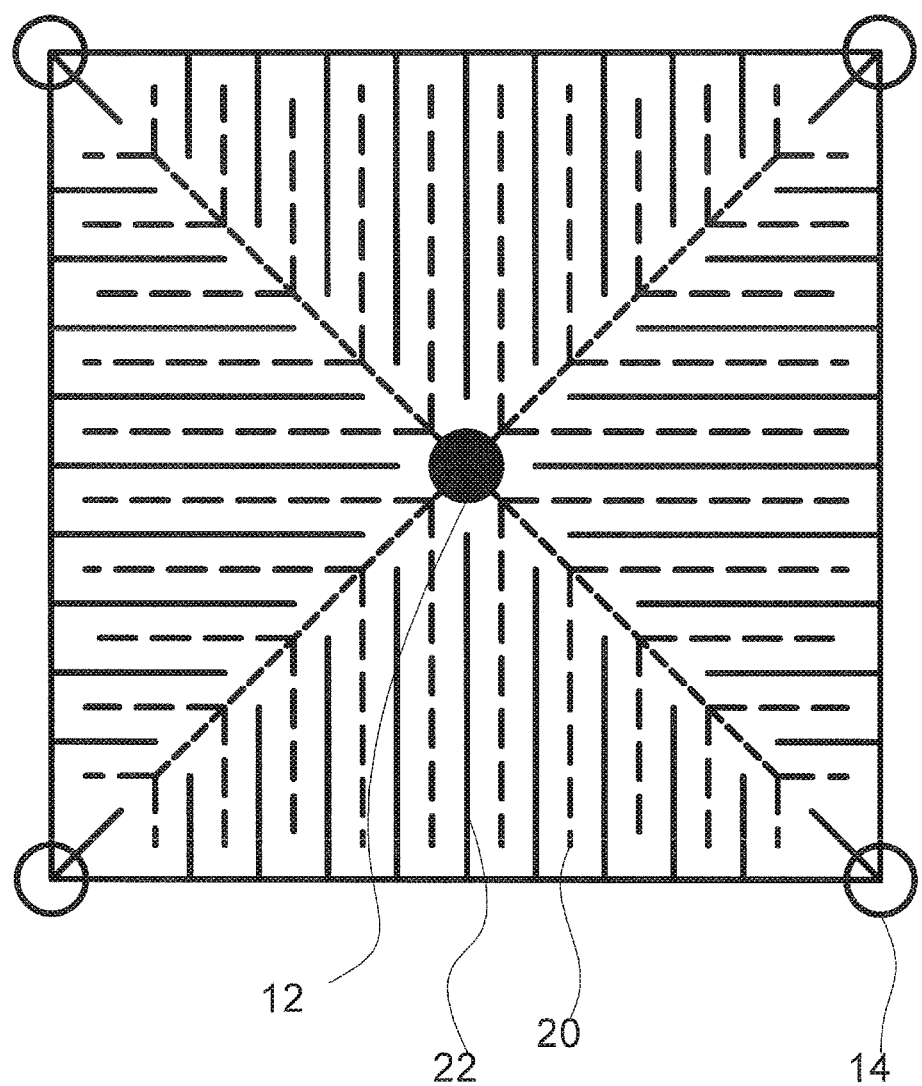

Many different layout patterns may be used for the first and second conductor lines 20, 22. More orders of branches may be used for example, or different angles between the branching lines. FIG. 3 shows a further example of the first and second conductor lines 20, 22 in a unit cell. Herein the second conductor lines are provided along the outline of a parallelogram that forms a periphery of the unit cell (a square is shown by way of example of a parallelogram, but any square or other parallelogram may be used). The first conductor lines extend diagonally from a contact point at the centre of the parallelogram to each of the four corners, with branches from the diagonal lines. The branches include first branches running parallel to one set of parallel edges of the parallelogram and second branches running parallel to the other set of parallel edges of the parallelogram. The first and second branches branch in opposite directions from the diagonal. In the case of a rectangular unit cell, the first and second branches extend perpendicularly to each other. The second conductor lines along the outline have branches towards the inside of the parallelogram, branches from different parts of the outline being parallel to and interdigitated with the first and second branches of the first conductor lines respectively.

Figure 4:
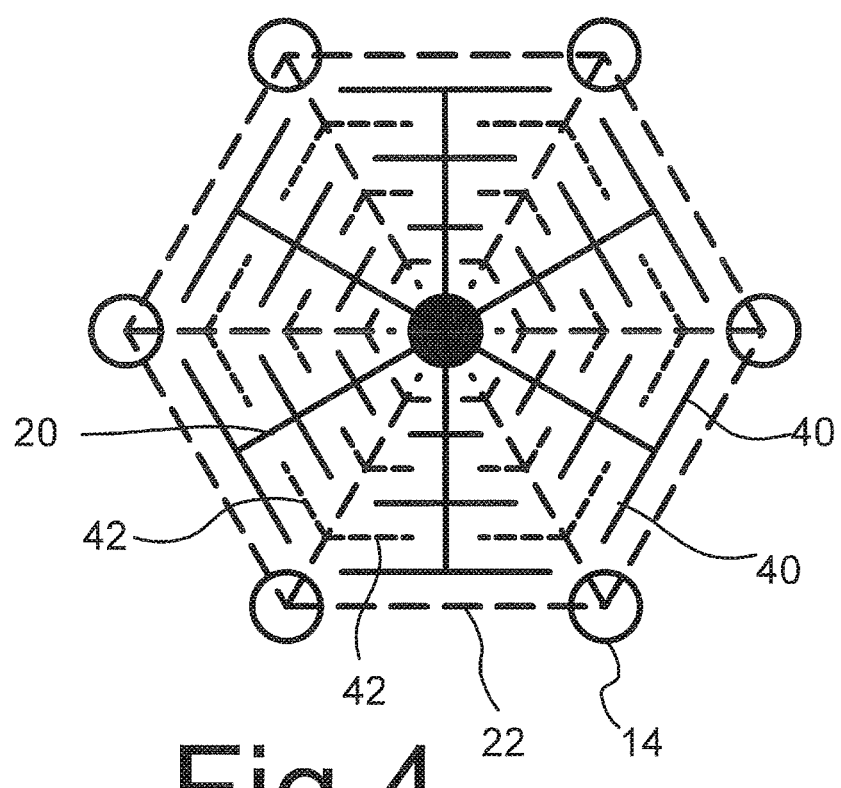

The unit cells need not be square. FIG. 4 shows an example of a hexagonal unit cell. By way of example, second contacts 12 are shown at all corners of the unit cell, but alternatively second contacts 12 may be provided at every second corner only. For the sake of illustration, second conductor lines 22 are shown by dashed lines in this figure, but is should be understood that they form continuous conductors. First conductor lines 20 radiate from the first contact at the centre of the unit cell at a number of angles, each at a sixty degree angle to its predecessor. First conductor lines 20 branch out, each time into a first radially directed conductor line that forms a first main branch and a pair of conductor lines that form first side branches 40 directed transverse to the radial direction. Second conductor lines 22 include conductor lines that run between the second contacts 14 along the borders of the unit cell and further conductor lines that are directed radially towards the centre of the unit cell. The further conductor branches out, each time into a radially directed conductor line that forms a second main branch and a pair of conductor lines that form second side branches 42 that are directed in parallel to the first side branches. The conductor lines that run between the second contacts 14 along the borders of the unit cell can also be seen as such second side branches. Each first side branch 40 extends between a respective pair of the second side branches 42.

Although the embodiment of FIG. 4 has been illustrated by means of straight conductor line sections in the side branches, that each branch off at the same angle to the main branch, it should be appreciated that this is not necessary. In an embodiment the side branches may be bent (having a continuous bend or straight sections at an angle to each other). The side branches may be bent for example so that a first part from the point where the first or second side branch branches off runs parallel to the tips of the adjacent second or first side branch respectively, and the tip of the first or second side branch is directed towards the branch point where an adjacent second or first side branch branches off. When the main branch and the side branch at a branch point are at an acute angle to each other, the tip of the adjacent side branch of the other conductor line may be directed towards this branch point. The side branch at the tip may extent the virtual line that bisects this acute angle. This reduces the distance from points on the back surface to the closest part of the first and second conductor lines 20, 22. In an embodiment, the side branches themselves may branch out into branches directed at adjacent branch points.

Although the conductor lines have been shown as lines in the figures, it should be realized that the term conductor line refers to a body of conductor material with a height and width transverse to the line direction that are greater than zero. The width (transverse to the lines shown in FIGS. 1-4) need not be as wide everywhere: it may narrow towards the tips of the branches. The width of the conductor lines may fill part of the space between the lines shown the conductor lines in the figures, leaving an opening to prevent short circuit: the lines shown in the figures may be considered to represent centre lines of the conductor lines rather than actual conductor lines. The part of the space between mutually closest points on conductor lines for base and emitters that is covered by the conductor lines need not be equally divided between the conductor lines for base and emitter areas. For example, the conductor lines for emitter areas may cover a greater part of the distance between the mutually closest points than the conductor lines for emitter areas. This may increase efficiency.

Figure 5:
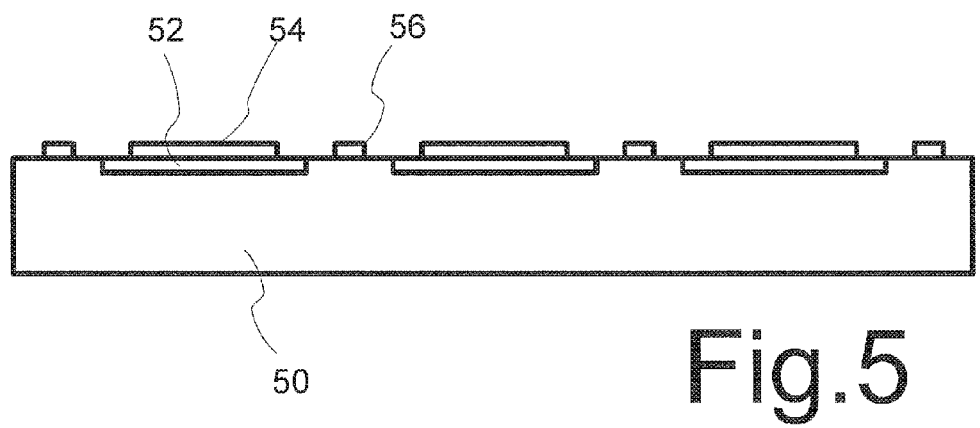
FIG. 5 shows a cross-section of a solar cell

FIG. 5 shows a cross-section of a solar cell comprising a semiconductor body 50, emitter areas 52, emitter contact electrodes 54 on the emitter areas 52 and base contact electrodes 56. Details such as dielectric layers, anti-reflection coating, texturing etc are not shown. The structure of such a cross-section is known per se. The emitter contact electrodes 54 and base contact electrodes 56 form part of the first and second conductor structure respectively, or the second and first conductor structure respectively, and are provided with branches as shown in the surface views. Preferably, the emitter fraction (the fraction of the surface that is covered by emitter areas 52) is maximized, or at least larger than the base fraction (the fraction of the surface that functions as base area). This may be realized by realizing the edges of the emitter areas under the conductor patterns such as shown in FIGS. 1-4 closer to the base electrodes than to the emitter electrodes. Thus, the emitter areas extend over more than half the distance between base electrodes. A photo voltaic cell is provided that has a semi-conductor body having a first and second surface opposite each other and a first and second two-dimensional array of contact points on the first surface, each coupled to a respective one of base and emitter areas in or on the semi-conductor body. External electrical contact to first and second two-dimensional array of contact points may be realized by means of layers of electrically conductive foil applied to the back surface, with an isolating layer in between. The layer closest to the semi-conductor substrate has openings for contacts to the layer further to the semi-conductor.

Figure 6:
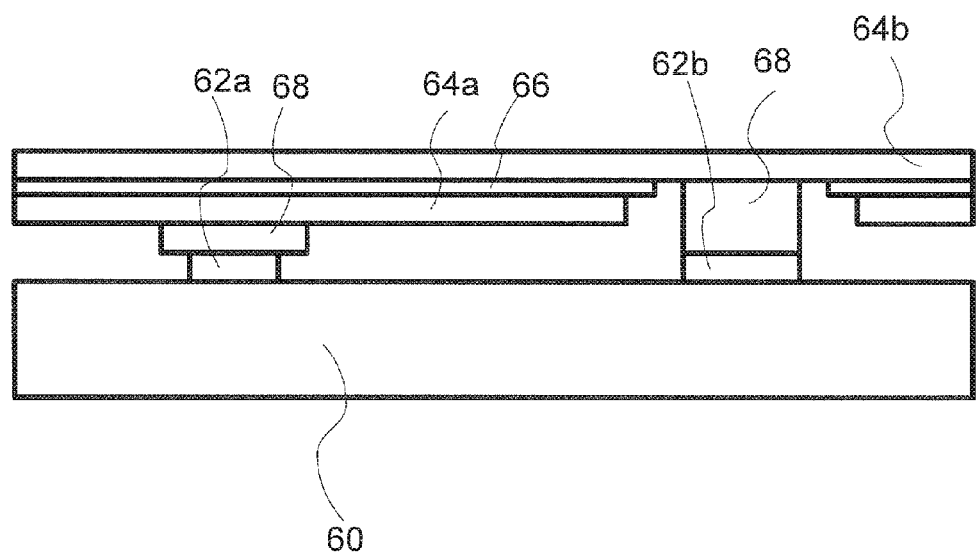
FIG. 6 shows a cross-section of the cell with connection foils

This is illustrated in FIG. 6, showing the semiconductor substrate 60 (details omitted) with contact points 62*a,b* from the first and second array, a first and second electrically conductive (e.g. metallic) foil 64*a, b*, separated by an electrically insulating foil 66. First and second electrically conductive foil 64*a, b* are electrically coupled to the contact points of the first and second array respectively, for example by conductive adhesive. The innermost foil 64*a* and the insulating layer 66 have openings over the contact points of the second array. The contact to the other foil is provided though these openings. Of course, other ways of connecting to the contact points are possible, such as wiring, mounting on a PCB with contact pads opposite the contact points etc. The use of foil makes it possible to provide for mass manufacture at lower cost.

The invention claimed is:

1. A photo-voltaic cell comprising:
   a semi-conductor body having first and second surfaces opposite to each other;
   first and second two-dimensional arrays of contact points on the first surface, each two-dimensional array of contact points coupled to a respective one of base and emitter areas in or on the semi-conductor body;
   electrically separate first and second conductor structures, both on the first surface of the semi-conductor body, on respective ones of the base and emitter areas and coupled to contact points of the first and second two-dimensional arrays, respectively;
   the first and second conductor structures forming a two-dimensionally periodic pattern of contiguous, equally shaped, rectangular or hexagonal unit cells on the first surface of the semi-conductor body, wherein
   the first conductor structure in each respective one of the unit cells comprises first conductor line branches radiating from the respective one of the contact points of the first two-dimensional array within each respective one of the unit cells in at least three successive different directions at less than a hundred and eighty degrees to each other, and
   the second conductor structure comprises conductor lines along borders of the respective one of the unit cells, surrounding the first conductor structure in the respective one of the unit cells, as well as second conductor line branches extending from the borders into the respective one of the unit cells, wherein the second conductor line branches of the second conductor structure extend in at least three different directions in areas between adjacent first conductor line branches in the respective one of the unit cells and wherein at least some of the second conductor line branches of the second conductor structure extend to areas between first conductor line branches of the first conductor structure in each respective one of the unit cells that are adjacent to the second conductor line branches of the second conductor structure, and
   wherein the contact points of the second two-dimensional array are located on the borders of the respective one of the unit cells and are in electrical contact with the conductor lines of the second conductor structure.

2. A photo-voltaic cell according to claim 1, wherein the second conductor line branches of the second conductor structure in the respective one of the unit cells branch into a tree structure with increasing numbers of second conductor line branches with decreasing distance to the respective one of the contact points of the first two-dimensional array in the respective one of the unit cells.

3. A photo-voltaic cell according to claim 2, wherein at least some of the second conductor line branches in the tree structure of the second conductor structure are bent, at least some of the second conductor line branches have a tip, and the tips of the second conductor line branches are directed at a branch point where a first conductor line branch branches into multiple first conductor line branches.

4. A photo-voltaic cell according to claim 1, wherein the unit cells are rectangular.

5. A photo-voltaic cell according to claim 1, wherein the unit cells are hexagonal.

6. A photo-voltaic cell according to claim 1, wherein at least some of the second conductor line branches of the second conductor structure extend to areas lying between non-parallel adjacent ones of the first conductor line branches of the first conductor structure in the unit cells.

7. A photo-voltaic cell according to claim 1, wherein the first conductor line branches branch into a tree structure with increasing numbers of first conductor line branches with decreasing distance from the respective one of the contact points of the first two-dimensional array.

8. A photo-voltaic cell according to claim 7, wherein the tree structure comprises pairs of adjacent first conductor line branches, and wherein the second conductor line branches extend to areas between each pair of adjacent branches in the tree structure.

9. A photo-voltaic cell according to claim 6, wherein the second conductor line branches in the areas between respective adjacent non-parallel ones of the first conductor line branches extend at least partly along a virtual line that bisects an angle between the adjacent non-parallel ones of the first conductor line branches.

10. A photo-voltaic cell according to claim 1, wherein the first conductor line branches have mutually equal width.

11. A photo-voltaic cell comprising:
    a semi-conductor body having first and second surfaces opposite to each other;
    first and second two-dimensional arrays of contact points on the first surface, each two-dimensional array of contact points coupled to a respective one of base and emitter areas in or on the semi-conductor body;
    a conductive foil on the first surface, coupled to the contact points of the first two-dimensional array of contact points,
    electrically separate first and second conductor structures, both on the first surface of the semi-conductor body, on respective ones of the base and emitter areas and coupled to contact points of the first and second two-dimensional arrays, respectively;
    the first and second conductor structures forming a periodic pattern of contiguous rectangular or hexagonal unit cells, wherein
    the first conductor structure in each respective one of the unit cells comprises first conductor line branches radiating from the respective one of the contact points of the first two-dimensional array within each respective one of the unit cells in at least three successive different directions at less than a hundred and eighty degrees to each other, and
    the second conductor structure comprises conductor lines along borders of the respective one of the unit cells, surrounding the first conductor structure in the respective one of the unit cells, as well as second conductor line branches extending from the borders into the respective one of the unit cells, wherein the second conductor line branches of the second conductor structure extend in at least three different directions in areas between adjacent first conductor line branches in the respective one of the unit cells and wherein at least some of the second conductor line branches of the second conductor structure extend to areas between first conductor line branches of the first conductor structure in each respective one of the unit cells that are adjacent to the second conductor line branches of the second conductor structure, and wherein the contact points of the second two-dimensional array are located on the borders of the respective one of the unit cells and are in electrical contact with the conductor lines of the second conductor structure.

* * * * *